United States Patent
Kawamoto et al.

[11] 3,953,809
[45] Apr. 27, 1976

[54] INJECTION LASER MODULATOR

[75] Inventors: Hirohisa Kawamoto, Kendall Park, N.J.; David Joseph Miller, Philadelphia, Pa.

[73] Assignee: RCA Corporation, New York, N.Y.

[22] Filed: Nov. 18, 1974

[21] Appl. No.: 524,757

[52] U.S. Cl. .................... 331/94.5 H; 331/94.5 M
[51] Int. Cl.² .......................................... H01S 3/096
[58] Field of Search ............... 331/94.5 H, 94.5 M, 331/94.5 PE; 357/17–19

[56] References Cited
UNITED STATES PATENTS

| | | | |
|---|---|---|---|
| 3,412,344 | 11/1968 | Pankove | 331/94.5 H |
| 3,855,605 | 12/1974 | Kawamoto | 357/13 |

*Primary Examiner*—John K. Corbin
*Assistant Examiner*—Wm. H. Punter
*Attorney, Agent, or Firm*—Edward J. Norton; George J. Seligsohn

[57] ABSTRACT

A carrier-injected avalanche device series connected to a forwardly-poled injection laser generates a current pulse, which may be as short as one nanosecond, through the injection laser only when both a direct current bias voltage is applied across this series connection from a charge supply and carriers have been injected into the device in response to the leading edge of a modulation trigger pulse. This current pulse through the injection laser is of sufficient magnitude to effect pumping thereof, so that the injection laser emits a corresponding pulse of coherent light, which may also be as short as one nanosecond.

6 Claims, 5 Drawing Figures

U.S. Patent  April 27, 1976  3,953,809
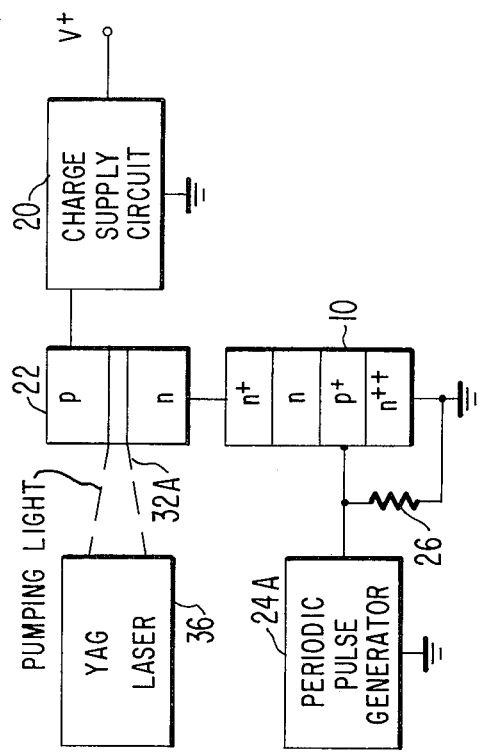
FIG. 1
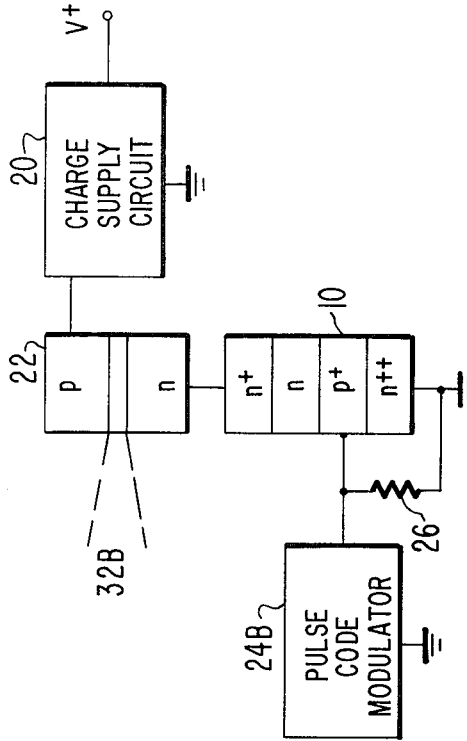
FIG. 3
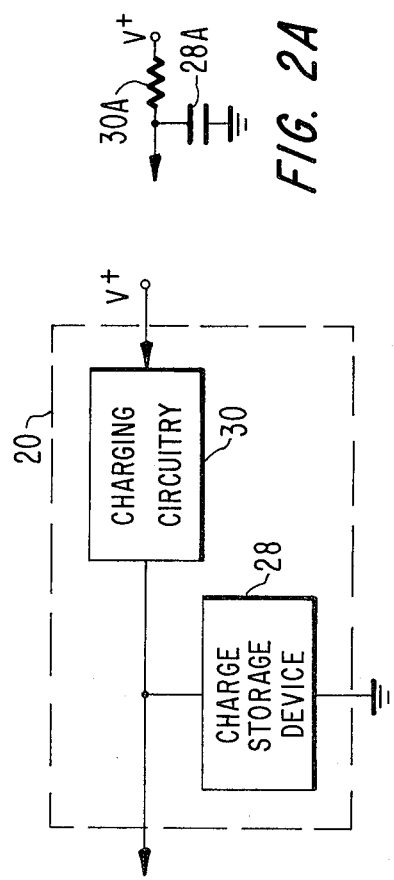
FIG. 2
FIG. 2A
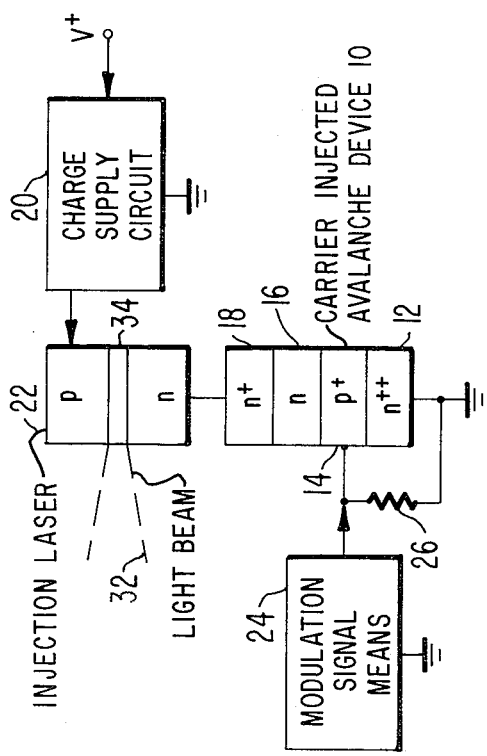
FIG. 4

INJECTION LASER MODULATOR

This invention relates to a technique for modulating an injection laser and, more particularly, to such a technique employing a series-connected carrier injected avalanche device for generating a pulse of coherent light from an injection laser diode in response to the injection of carriers into the carrier injected avalanche device.

Reference is made to the copending United States patent application Ser. No. 383,081, filed July 27, 1973 of H. Kawamoto, which is assigned to the same assignee as the present application. This Kawamoto patent application Ser. No. 383,081, which issued Dec. 17, 1974 as U.S. Pat. No. 3,855,605, is directed to a carrier injected avalanche device. As described therein, a carrier injected avalanche device comprises a two terminal avalanche diode having at least first, second and third crystalline semiconductor layers, but may also include a fourth layer. The first and third layers, which consist of a highly doped semiconductor material, form junctions with the second layer, which consists of a lightly doped semiconductor material. The type of doping in the second layer is the same as that of the third layer, but different from that of the first layer. The fourth layer, if used, forms an additional junction with the first layer and has the same type of doping as the second layer.

In operation, a reverse bias signal, having a magnitude less than a predetermined threshold level, applied across the avalanche diode terminals is insufficient in itself to cause avalanche breakdown. However, if external carriers are injected into the second semiconductor layer, avalanche breakdown does occur. Therefore, by injecting external carriers into the second semiconductor layer, the diode is made to operate as a carrier injected avalanche device which generates a relatively large amplitude output voltage pulse in response to the injection of these external carriers. In a particular example of a carrier injected avalanche device described in the Kawamoto patent application Ser. No. 383,081, the duration of this output voltage pulse is quite short, being only about five nanoseconds in duration.

The embodiments of the present invention make use of a carrier injected avalanche device, which is capable of producing an output current pulse having a duration of only about one nanosecond. In accordance with the principles of the present invention, it has been found that when a carrier injected avalanche device is reverse biased through a forwardly-poled injection laser diode, which is connected in series with the carrier injected avalanche device, the output current pulse of the carrier injected avalanche device is large enough to pump the injection laser, thereby resulting in the injection laser emitting a corresponding pulse of coherent light. By employing the carrier injected avalanche device disclosed herein, the duration of this pulse of coherent light from the injection laser may be made as short as one nanosecond.

These and other features and advantages of the present invention will become more apparent from the following detailed description taken together with the accompanying drawing, in which:

FIG. 1 is a block diagram of an embodiment of the present invention;

FIG. 2 is a block diagram of a preferred embodiment of the charge supply circuit of FIG. 1 and FIG. 2A is a schematic diagram of the simplest specific embodiment of the charge supply circuit of FIG. 1;

FIG FIG. is an embodiment of a first particular useful application of the present invention, and FIG. 4 is an embodiment of a second particular useful application of the present invention.

Referring now to FIG. 1, there is shown a carrier injected avalanche device 10. The carrier injected avalanche device 10 consists of layer 12; which is very highly doped in n-type, followed, in turn, by a layer 14 doped in p-type, a layer 16 lightly doped in n-type, and a layer 18 which is doped in n-type at a concentration intermediate first layer 12 and third layer 16. In an alternative embodiment, the operation will be similar by providing doping of the respective layers 12, 14, 16, 18 in the opposite sense, namely, $p^{++}$, $n^+$, $p$, $p^+$.

Layer 14, layer 16 and layer 18 of carrier injected avalanche device 10 form by themselves a three-terminal Trapatt device, which is a $p^+$-$n$-$n^+$ punch-through diode with a typical Trapatt impurity profile. Layers 14, 16 and 18 correspond to the first, second and third layers of the carrier-injected avalanche diode disclosed in the aforesaid patent application Ser. No. 383,081, discussed above. The $n^{++}$ layer 12 of carrier injected avalanche device 10 is added to form a second junction with $p^+$ layer 14. Layer 14 corresponds to the fourth layer, discussed above, in connection with patent application Ser. No. 383,081. If the $p^+$-$n$-$n^+$ junction, formed by layers 14, 16 and 18, is reverse biased near avalanche breakdown and at the same time the $n^{++}$-$p^+$ junction, the control junction formed by layers 12 and 14, is used to inject carriers, carrier injected avalanche device 10 is triggered to produce a trapped plasma. The higher doping of the $n^{++}$ layer 12, compared to the doping of the corresponding fourth layer of the carrier injected avalanche device of patent application Ser. No. 383,081 increases the electron injection efficiency permitting more sensitive control.

As is further shown in FIG. 1, a positive voltage with respect to a point of reference potential is applied from a charge supply circuit 20 through a forwardly-poled injection laser 22 to layer 18 of carrier injected avalanche device 10, while layer 12 of carrier injected avalanche device 10 is coupled to the point of reference potential. Therefore, injection laser 22 is serially connected to carrier injected avalanche device 10. By way of example, injection laser 22 may be a $Ga_xAl_{1-x}As$ double heterojunction injection laser having a striped shaped cavity. However, any other type of well known injection laser diode may be employed.

Modulation signal means 24 supplies a voltage pulse across a resistance 26. This voltage pulse across resistance 26, which is applied between layer 14 and layer 12, is of sufficient magnitude, such as 0.6 volt, to inject sufficient carriers across the $n^{++}$-$p^+$ control junction between layers 12 and 14 to trigger a trapped plasma in carrier injected avalanche device 10.

As shown in FIG. 2, charge supply circuit 20 preferably includes a charge storage device 28, which is charged to a positive voltage $V^+$ by suitable charging circuitry 30. In its simplest form, shown in FIG. 2A, charge storage device 28 may be a capacitance 28A and charging circuitry 30 may be a resistance 30A. The rates at which capacitance 28A can be charged through the resistance 30A is limited by the inherent time constant of the circuit shown in FIG. 2A. This inherent charging time constant is no problem so long as the repetition rate at which capacitance 28A is repetitively charged and discharged is no greater than four megahertz. However, by employing a more sophisticated charging circuitry 30 which incorporates some active devices therein to basically short out the resistance, such as resistance 30A, during each charging of capacitance 28A, capacitance 28A can be repetitively charged to a required level, such as $10^{+8}$ Coulombs, and discharged at repetition rates up to 500 MHz.

Considering now the operation of the system shown in FIG. 1, carrier injected avalanche device 10 remains in a high impedance state (virtual open circuit), despite the presence of an applied direct current bias voltage thereacross from charge supply circuit 20, until sufficient carriers have been injected into second layer 14 in response to the leading edge of an applied pulse from modulation signal means 24. The injection of these carriers causes avalanche breakdown to occur in carrier injected avalanche device 10, thereby resulting in carrier injected avalanche device 10 switching to a low impedance state. Since forwardly-biased injection laser 22 also exhibits a low impedance, charge supply circuit 20 dissipates its stored charge through serially-connected injected laser 22 and carrier injected avalanche device 10, resulting in a current pulse therethrough. This current pulse passing though injection laser 22 is of sufficient magnitude to pump injection laser 22 above its lasing threshold so that the injection laser 22 emits a pulse of light which forms light beam 32 from optical resonant cavity portion 34 of injection laser 22 (which exists in the vicinity of the p-n junction device thereof, as is known in the laser art).

The dissipation of the charge stored in charge supply circuit 20 by the current pulse causes the magnitude of the dc bias voltage across carrier injected avalanche device 10 to fall below that level which is required to sustain avalanche breakdown in device 10. Therefore, carrier injected avalanche device 10 switches back to its high impedance state, thereby extinguishing the current pulse. A current pulse, as well as the accompanying light-beam pulse 32, having a duration as short as one nanosecond has been achieved. It has been further found that the current pulse width is independent of the duration of the modulating pulse from modulation signal means 24. Specifically, a one-nanosecond current pulse is maintained even when the modulation input pulse width is varied over a range extending from 2.5 nanoseconds to 100 nanoseconds. Thus the system shown in FIG. 1 inherently provides a pulse-sharpening characteristic.

When the pulse width of the pumping current pulse through injection laser 22 is only in the order of one nanosecond, injection laser 22 may operate without burn-out even at a current level ten times the dc lasing threshold, thereby providing high light power. By way of example, the $Ga_xAl_{1-x}As$ double heterojunction laser described above generated one nanosecond light pulses, each of which had an optical power level as high as two watts. Also, because this injection laser was driven at a level 10 times the dc lasing threshold, the time delay from the current drive to lasing output decreased to less than one nanosecond. This eliminated any need for a pre-pumping current source usually required in energizing an injection laser for the purpose of keeping this time delay short.

An important characteristic of carrier injected avalanche device 10 is that it has a relaxation time of less than 1 nanosecond so that it is capable of being modulated by a serial stream of pulses from modulation signal means 24 having a repetition rate as high as 500 MHz. In such a case, light beam 32 consists of a stream of successive one-nanosecond light pulses occuring at a duty cycle up to 50%.

Referring now to FIG. 3, there is shown a continuous YAG laser 36 which is pumped with pumping light 32A composed of a stream successive light pulses occurring at a duty cycle determined by the repetition rate of periodic pulse generator 24A (which operates as a modulation signal means for repetitively injecting carriers into carrier injected avalanche device 10 in response to the leading edge of each successive periodic modulating pulse therefrom). By making the repetition rate of periodic pulse generator 24A higher than the relaxation time of YAG laser 36, YAG laser 36 operates continuously, despite the fact it is being pumped with pulsed pumping light.

Referring now to FIG. 4, there is shown an important use of the system of the present invention as a transmitter for an optical data communication system. Specifically, pulse code modulator 24B serves as the modulation signal means for carrier injected avalanche device in FIG. 4. Each successive pulse from pulse code modulator 24B results in the transmission of a corresponding light pulse by light means 32B. For the reasons discussed above, data may be optically transmitted at data rates up to 500 megabits per second. Further, each optical pulse may have a duration of only 1 nanosecond and have a peak power of 2 watts. This relatively large power means that an optical data communication system incorporating the present invention requires fewer repeater stations, which may be spaced further away from each other.

In addition, the fact that the width of the light pulse from the injection laser is independent of the width of the modulating trigger pulse from pulse code modulator 24B (i.e., it is only the leading edge of this pulse which triggers the generation of the one-nanosecond light pulse output) lends itself to optical communication. This is so because, in practice, the light pulse spreads in width as it travels to the next repeater station through either a fiber optical transmission line or the atmosphere because of the dispersive qualities of the media. Therefore, at the next repeater station, pulse narrowing circuitry (which would normally be required) is not required, since the carrier injected avalanche device 10 at this next repeater station inherently generates one-nanosecond pulses anew when triggered by the widened light pulses received from the preceding repeater station.

What is claimed is:

1. In combination, a carrier injected avalanche device, an injection laser connected in series with said avalanche device for generating a pulse of coherent light from said injection laser only when both a direct-current voltage of given magnitude across said avalanche device is applied thereto through said injection laser with said injection laser poled to be forwardly conducting and at least a given amount of carriers are injected into said avalanche device, a charge supply circuit coupled across said serially-connected avalanche device and injection laser for supplying said direct-current voltage across said avalanche device until avalanching in said avalanche device has taken place, and modulation signal means for injecting said carriers into said avalanche device.

2. The combination defined in claim 1, wherein said modulation signal means comprises a pulse code modulator whereby said injection laser transmits coherent-light pulses corresponding to the pulse code from said modulator.

3. The combination defined in claim 1, wherein said charge supply circuit comprises a charge storage device and a charging circuit for charging said charge storage device to a potential substantially equal to said direct-current voltage.

4. The combination defined in claim 3, wherein said charge storage device comprises a capacitance and said charging circuit comprises a resistance coupling said charge storage device to a point of fixed potential.

5. The combination defined in claim 1, further including a light-pumped crystal laser which continues to lase for at least a given time interval after the termination of light-pumping thereof, said crystal laser being positioned to be illuminated and light pumped by coherent light pulses from said injection laser and wherein said modulation signal means comprises means for applying a series of carrier-injection pulses to said avalanche device at a pulse repetition period equal in duration to said given time interval, whereby said crystal laser operates as a CW laser.

6. The combination defined in claim 5, wherein said crystal laser is a YAG laser.

* * * * *